United States Patent
Park

(10) Patent No.: US 10,347,502 B2
(45) Date of Patent: Jul. 9, 2019

(54) METHODS FOR MANUFACTURING SEMICONDUCTOR DEVICES HAVING THREE-DIMENSIONALLY ARRANGED MEMORY CELLS

(71) Applicant: Samsung Electronics Co., Ltd., Suwon-si, Gyeonggi-do (KR)

(72) Inventor: Jongchul Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/908,845

(22) Filed: Mar. 1, 2018

(65) Prior Publication Data

US 2019/0074189 A1    Mar. 7, 2019

(30) Foreign Application Priority Data

Sep. 7, 2017 (KR) .................. 10-2017-0114639

(51) Int. Cl.

| | |
|---|---|
| *H01L 21/4763* | (2006.01) |
| *H01L 21/311* | (2006.01) |
| *H01L 27/11524* | (2017.01) |
| *H01L 27/11556* | (2017.01) |
| *H01L 27/11568* | (2017.01) |
| *H01L 27/11582* | (2017.01) |
| *H01L 23/528* | (2006.01) |
| *H01L 21/768* | (2006.01) |

(Continued)

(52) U.S. Cl.
CPC .. *H01L 21/31116* (2013.01); *H01L 21/31144* (2013.01); *H01L 21/76816* (2013.01); *H01L 21/76877* (2013.01); *H01L 23/528* (2013.01); *H01L 23/5227* (2013.01); *H01L 27/11524* (2013.01); *H01L 27/11556* (2013.01); *H01L 27/11568* (2013.01); *H01L 27/11582* (2013.01); *H01J 37/32412* (2013.01); *H01J 37/32422* (2013.01); *H01J 2237/334* (2013.01)

(58) Field of Classification Search
None
See application file for complete search history.

(56) References Cited

U.S. PATENT DOCUMENTS

| | | |
|---|---|---|
| 6,897,158 B2 | 5/2005 | Sharma |
| 8,971,118 B2 | 3/2015 | Jin et al. |

(Continued)

FOREIGN PATENT DOCUMENTS

| | | |
|---|---|---|
| KR | 10-1043740 | 3/2010 |

*Primary Examiner* — Angel Roman
(74) *Attorney, Agent, or Firm* — Myers Bigel, P.A.

(57) ABSTRACT

Methods for manufacturing semiconductor devices may include forming a stack structure including layers stacked on a substrate, forming a mask pattern on the stack structure, and patterning the stack structure using the mask pattern such that the stack structure has an end portion with a stepped profile. The patterning of the stack structure may include performing a pad etching process of etching the stack structure using the mask pattern as an etch mask, and performing a mask etching process of etching a sidewall of the mask pattern. The performing of the mask etching process may include irradiating an ion beam onto the mask pattern, which may be irradiated at a first tilt angle with respect to the sidewall of the mask pattern and at a second tilt angle with respect to a top surface of the mask pattern. The first tilt angle may be different from the second tilt angle.

20 Claims, 21 Drawing Sheets

(51) Int. Cl.
    *H01L 23/522*     (2006.01)
    *H01J 37/32*     (2006.01)

(56) References Cited

U.S. PATENT DOCUMENTS

| | | |
|---|---|---|
| 9,202,707 B2 | 12/2015 | Kawamata et al. |
| 9,337,040 B1 * | 5/2016 | Renau ............... H01L 21/26586 |
| 9,627,610 B2 | 4/2017 | Park et al. |
| 2014/0329379 A1 | 11/2014 | Kim et al. |
| 2016/0329345 A1 * | 11/2016 | Hu ...................... H01L 27/1157 |
| 2017/0263639 A1 * | 9/2017 | Saito ................. G11C 16/0483 |
| 2017/0294383 A1 * | 10/2017 | Tanzawa ........... H01L 27/11582 |
| 2017/0309769 A1 * | 10/2017 | Engel ................... H01L 31/109 |

* cited by examiner

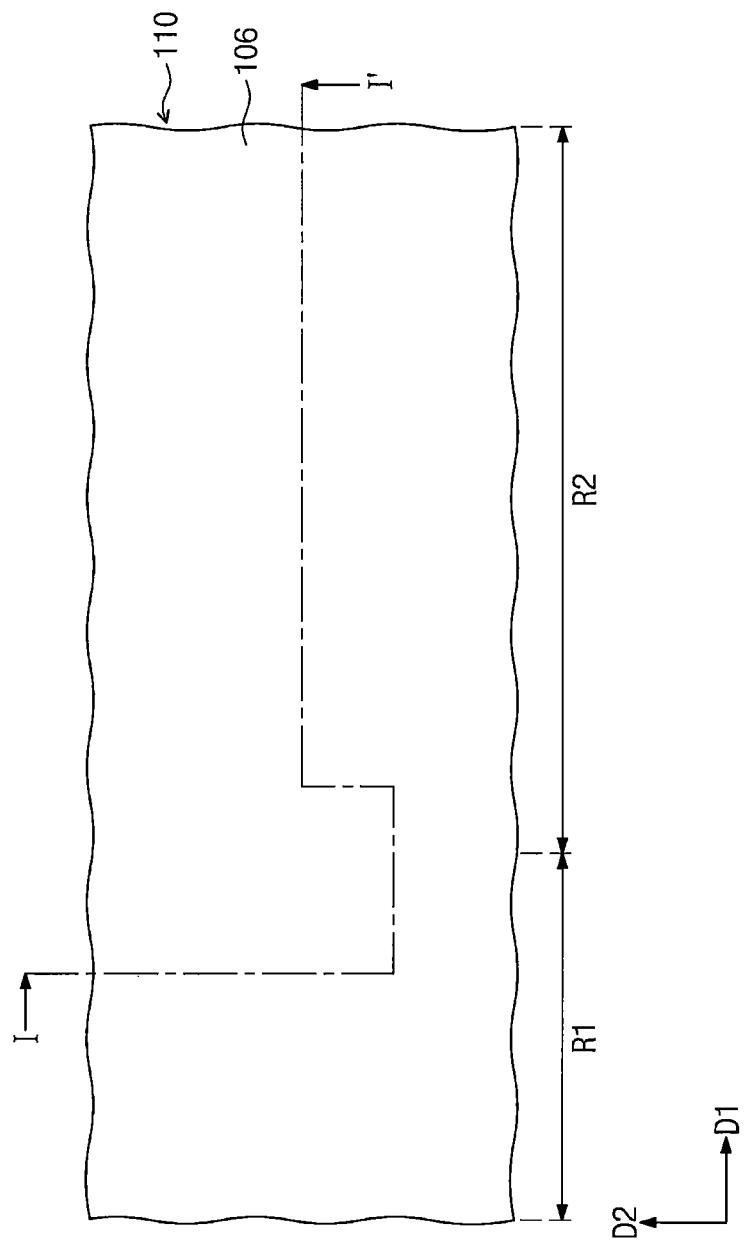

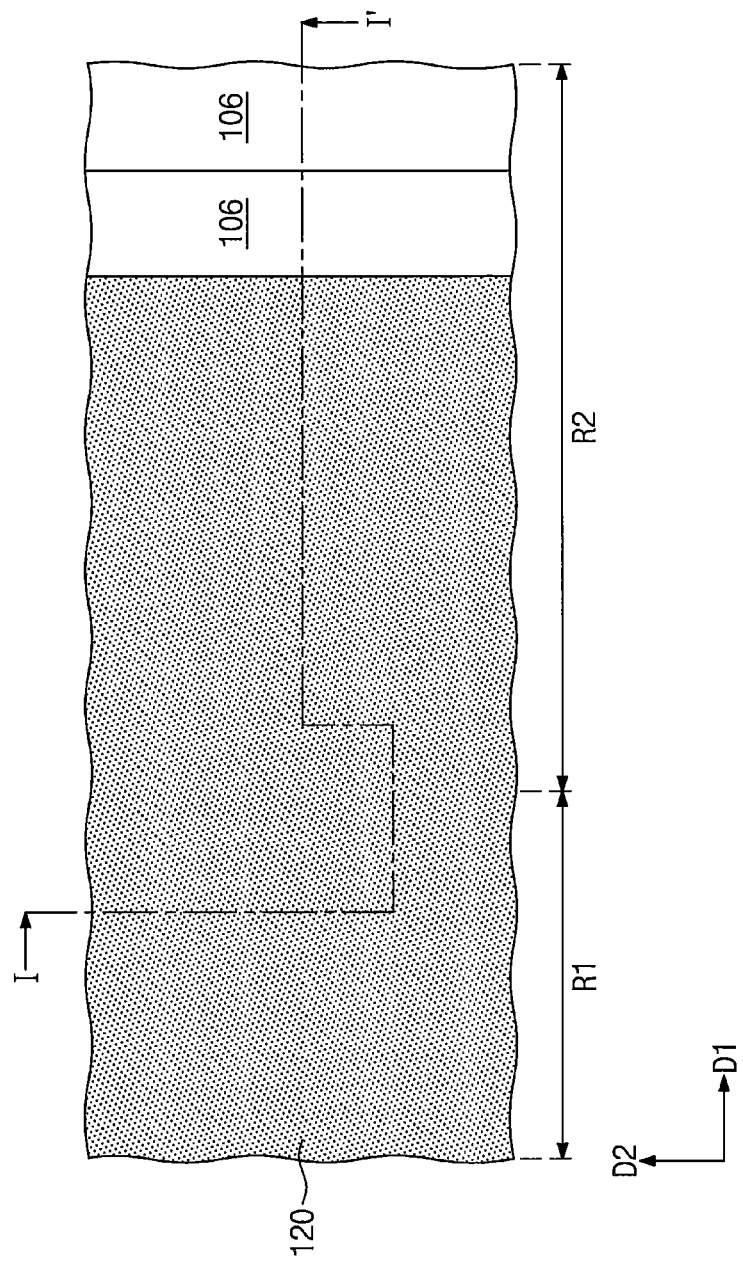

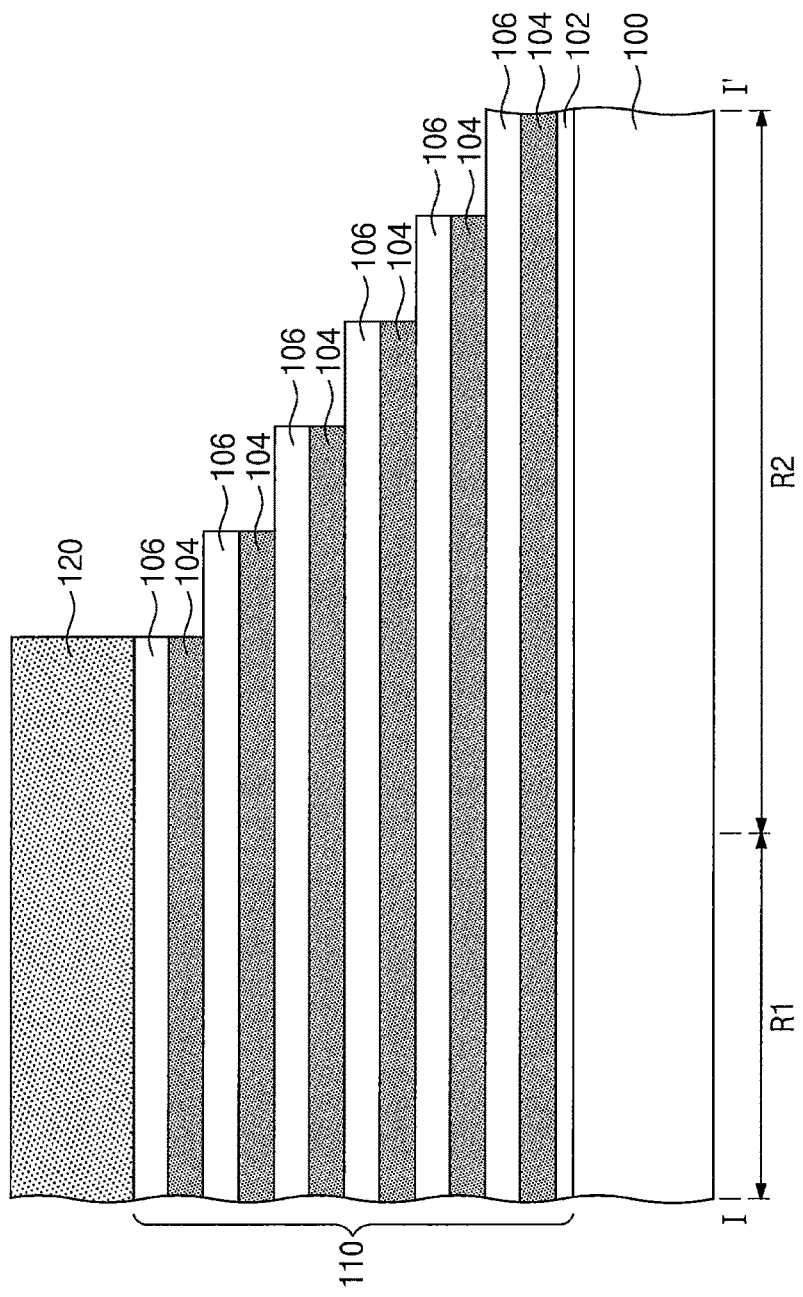

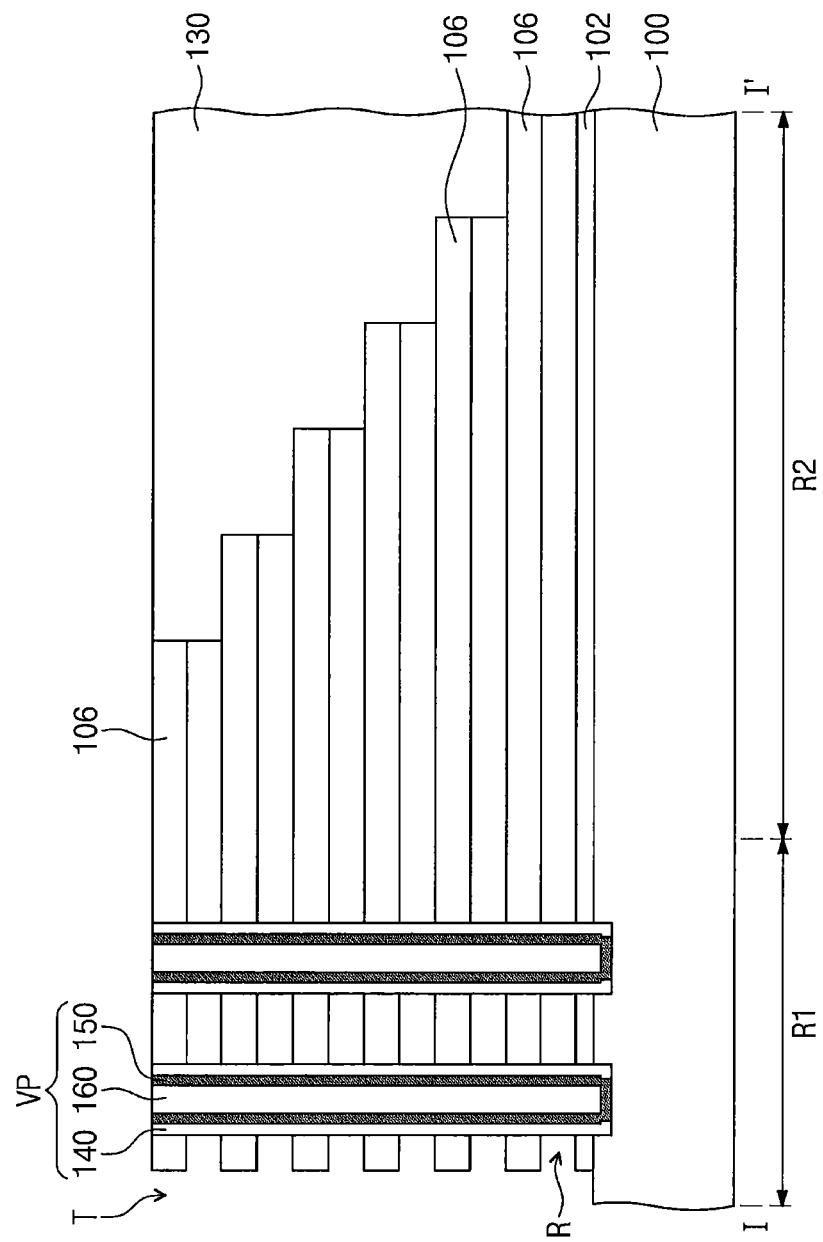

METHODS FOR MANUFACTURING SEMICONDUCTOR DEVICES HAVING THREE-DIMENSIONALLY ARRANGED MEMORY CELLS

CROSS-REFERENCE TO RELATED APPLICATION

This U.S. non-provisional patent application claims priority under 35 U.S.C. § 119 to Korean Patent Application No. 10-2017-0114639, filed on Sep. 7, 2017, in the Korean Intellectual Property Office, the disclosure of which is hereby incorporated by reference in its entirety for all purposes.

BACKGROUND

Aspects of the present disclosure relate to methods for manufacturing a semiconductor devices and, more particularly, to a method for manufacturing a three-dimensional (3D) semiconductor device having three-dimensionally arranged memory cells.

Semiconductor devices are increasingly highly integrated to provide excellent performance and low manufacture costs. The integration density of semiconductor devices may affect the costs of the semiconductor devices, thereby resulting in demand for highly integrated semiconductor devices. The integration density of conventional two-dimensional (2D) or planar semiconductor devices may be mainly determined by an area where a unit memory cell occupies. Therefore, the integration density of the conventional 2D semiconductor devices may be greatly affected by a technique of forming fine patterns. However, since extremely high-priced apparatuses may be needed to form fine patterns, the integration density of 2D semiconductor devices continues to increase but is still limited.

Three-dimensional (3D) semiconductor devices have been developed to overcome the above limitations. However, a cost per bit of 3D semiconductor devices may be expensive as compared with that of 2D semiconductor devices, and thus it may be desirable to develop process techniques capable of reducing the cost per bit and of improving reliability.

SUMMARY

Aspects of the present disclosure may provide methods for manufacturing semiconductor devices, which may be capable of simplifying manufacturing processes.

Aspects of the present disclosure may also provide methods for manufacturing semiconductor devices, which may be capable of reducing manufacture costs.

In an aspect, a method for manufacturing a semiconductor device may include forming a stack structure including a plurality of layers vertically stacked on a substrate, forming a mask pattern on the stack structure, and patterning the stack structure using the mask pattern as an etch mask such that the stack structure has an end portion with a stepped profile. The patterning of the stack structure may include performing a pad etching process of etching the stack structure using the mask pattern as an etch mask, and performing a mask etching process of etching a sidewall of the mask pattern. The performing of the mask etching process may include irradiating an ion beam onto the mask pattern. The ion beam may be irradiated at a first tilt angle with respect to the sidewall of the mask pattern and may be irradiated at a second tilt angle with respect to a top surface of the mask pattern. The first tilt angle may be different from the second tilt angle.

In an aspect, a method for manufacturing a semiconductor device may include forming a stack structure including a plurality of layers vertically stacked on a substrate, forming a mask pattern on the stack structure, performing a pad etching process of etching the stack structure using the mask pattern as an etch mask, and performing a mask etching process of etching a sidewall of the mask pattern to expose a portion of a topmost surface of the stack structure, after the pad etching process. The mask etching process may be an ion beam etching process using an ion beam. The ion beam may be irradiated at a first tilt angle with respect to the sidewall of the mask pattern and may be irradiated at a second tilt angle with respect to a top surface of the mask pattern. The first tilt angle may be different from the second tilt angle.

BRIEF DESCRIPTION OF THE DRAWINGS

The inventive concepts provided herein will become more apparent in view of the attached drawings and accompanying detailed description.

FIGS. 4A, 5A, 6A, 7A, 8A, 9A, 10A, 11A, and 12A are plan views illustrating a method for manufacturing a semiconductor device according to aspects of the present disclosure.

FIGS. 4B, 5B, 6B, 7B, 8B, 9B, 10B, 11B, and 12B are cross-sectional views taken along lines I-I' of FIGS. 4A, 5A, 6A, 7A, 8A, 9A, 10A, 11A, and 12A, respectively.

DETAILED DESCRIPTION

Hereinafter, example embodiments of the inventive concepts provided herein will be described in detail with reference to the accompanying drawings.

Figure 1:
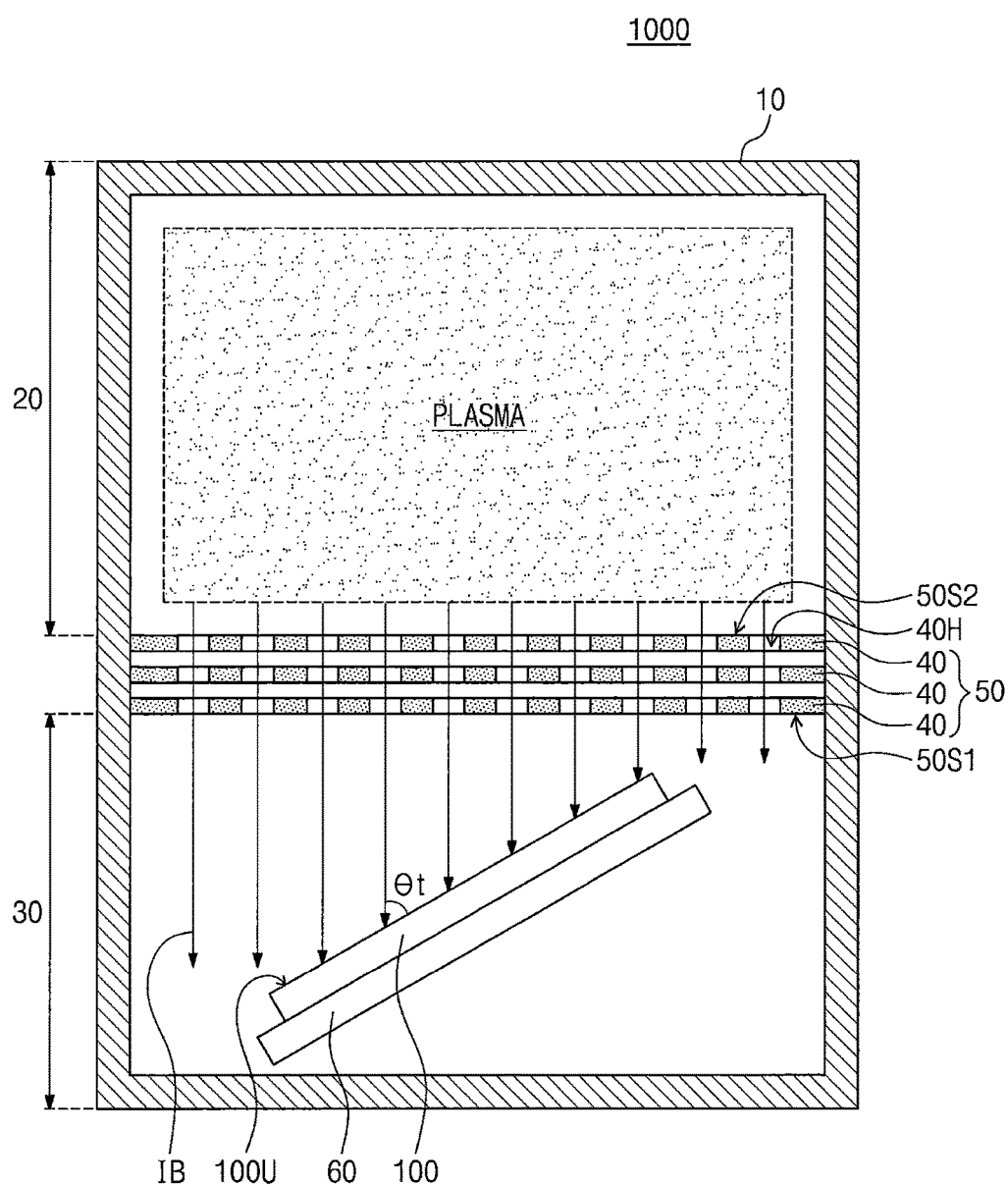
FIG. 1 is a schematic view illustrating an ion beam etching apparatus used in a method for manufacturing a semiconductor device according to aspects of the present disclosure.
Figure 2:
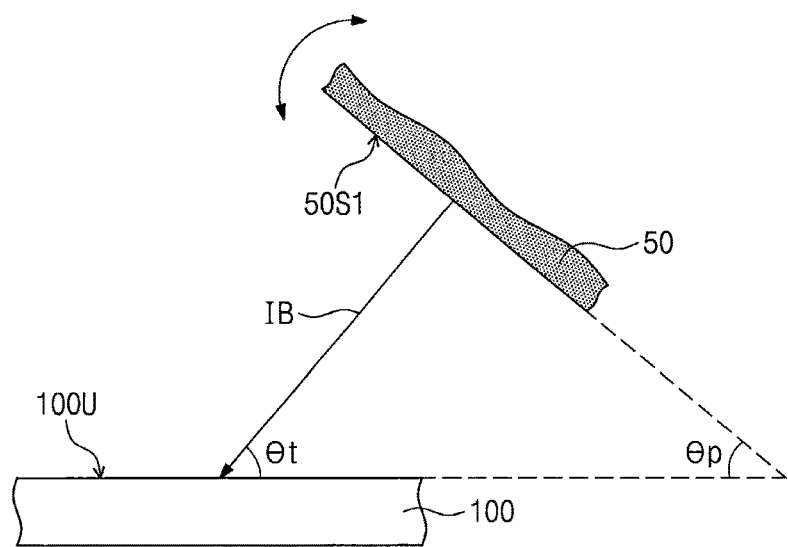
FIGS. 2 and 3 are conceptual diagrams illustrating methods for adjusting a tilt angle of an ion beam of FIG. 1.
Figure 3:
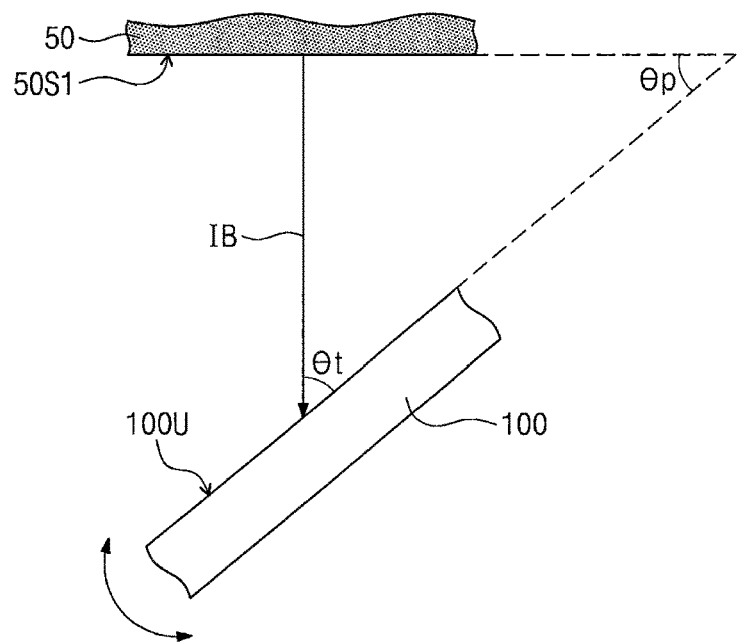

FIG. 1 is a schematic view illustrating an ion beam etching apparatus used in a method for manufacturing a semiconductor device according to aspects of the present disclosure. FIGS. 2 and 3 are conceptual diagrams illustrating methods for adjusting a tilt angle of an ion beam of FIG. 1.

Referring to FIG. 1, an ion beam etching apparatus 1000 may include a chamber 10 in which an etching process using an ion beam IB may be performed. The chamber 10 may include a source part 20 generating plasma, and a process part 30 into which the ion beam IB extracted from the plasma may be irradiated. The apparatus 1000 may include a grid 50 that is provided in the chamber 10 and is between the source part 20 and the process part 30. The grid 50 may extract the ion beam IB from the plasma. The grid 50 may include a plurality of electrode plates 40 vertically overlapping with each other, and each of the electrode plates 40 may have a plurality of holes 40H penetrating the electrode plate 40. The ion beam IB may be extracted from the plasma by an electric field generated from the plurality of electrode plates 40 and may be accelerated into the process part 30 by the electric field. The ion beam IB may be irradiated into the process part 30 through the holes 40H. The apparatus 1000 may include a stage 60 provided in the process part 30. A substrate 100 provided into the process part 30 may be loaded on the stage 60.

The grid 50 may include a first surface 50S1 and a second surface 50S2 opposite to each other. The first surface 50S1 of the grid 50 may be adjacent to the process part 30, and the second surface 50S2 of the grid 50 may be adjacent to the source part 20. In the case in which the grid 50 includes a plurality of electrode plates 40, the first surface 50S1 may be a surface of one of the plurality of electrode plates 40 that is closest to the process part 30. The second surface 50S2 may be a surface of another of the plurality of electrode plates 40 that is closest to the source part 20. The grid 50 may be disposed such that the first surface 50S1 faces the substrate 100. Relative arrangement of the grid 50 and the substrate 100 may be such that the ion beam IB is irradiated at a tilt angle θt with respect to a top surface 100U of the substrate 100.

In some embodiments, referring to FIG. 2, the grid 50 may be disposed such that the first surface 50S1 of the grid 50 is inclined or tilted with respect to the top surface 100U of the substrate 100. The tilt angle θt of the ion beam IB may be dependent on an angle θp between the first surface 50S1 of the grid 50 and the top surface 100U of the substrate 100. The grid 50 may be rotated to adjust the angle θp, and thus the tilt angle θt of the ion beam IB may be adjusted.

In some embodiments, referring to FIG. 3, the substrate 100 may be disposed such that the top surface 100U of the substrate 100 is inclined or tilted with respect to the first surface 50S1 of the grid 50. The tilt angle θt of the ion beam IB may be dependent on the angle θp between the first surface 50S1 of the grid 50 and the top surface 100U of the substrate 100. The substrate 100 may be rotated to adjust the angle θp, and thus the tilt angle θt of the ion beam IB may be adjusted.

Referring again to FIG. 1, the ion beam IB may be irradiated at the tilt angle θt with respect to the top surface 100U of the substrate 100, and thus the etching process using the ion beam IB may be performed on the substrate 100.

Figure 13:
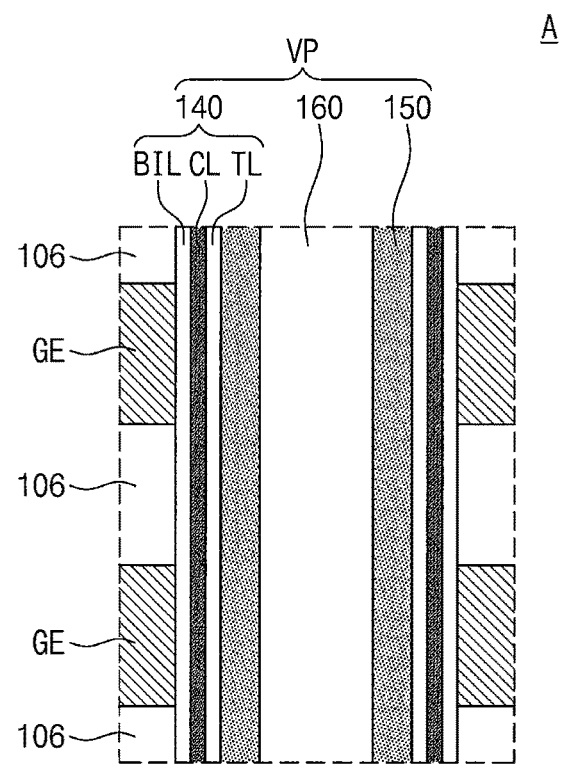
FIG. 13 is an enlarged view of a portion 'A' of FIG. 12B.
Figure 14:
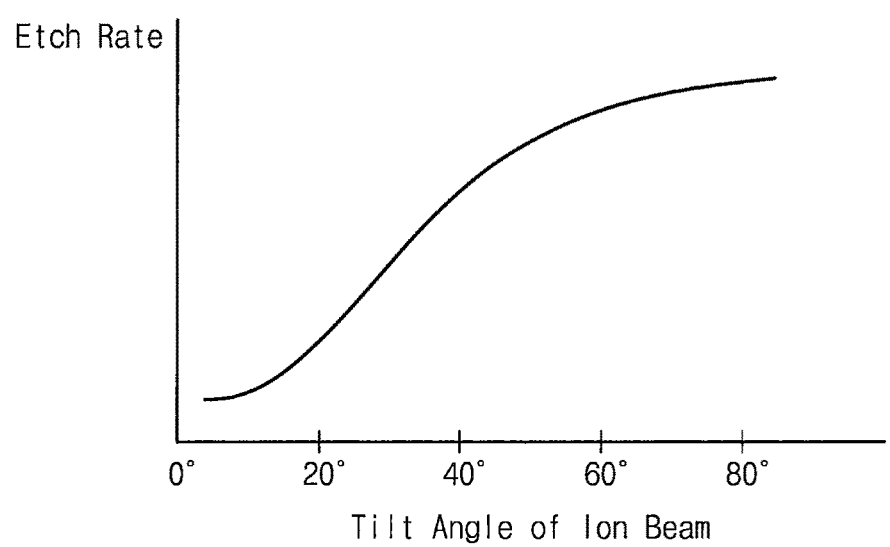
FIG. 14 is a graph illustrating an etch rate of a mask pattern according to a tilt angle of an ion beam.

FIGS. 4A, 5A, 6A, 7A, 8A, 9A, 10A, 11A, and 12A are plan views illustrating a method for manufacturing a semiconductor device according to aspects of the present disclosure, and FIGS. 4B, 5B, 6B, 7B, 8B, 9B, 10B, 11B, and 12B are cross-sectional views taken along lines I-I' of FIGS. 4A, 5A, 6A, 7A, 8A, 9A, 10A, 11A, and 12A, respectively. FIG. 13 is an enlarged view of a portion 'A' of FIG. 12B. FIG. 14 is a graph illustrating an etch rate of a mask pattern according to a tilt angle of an ion beam.

Figure 4B:
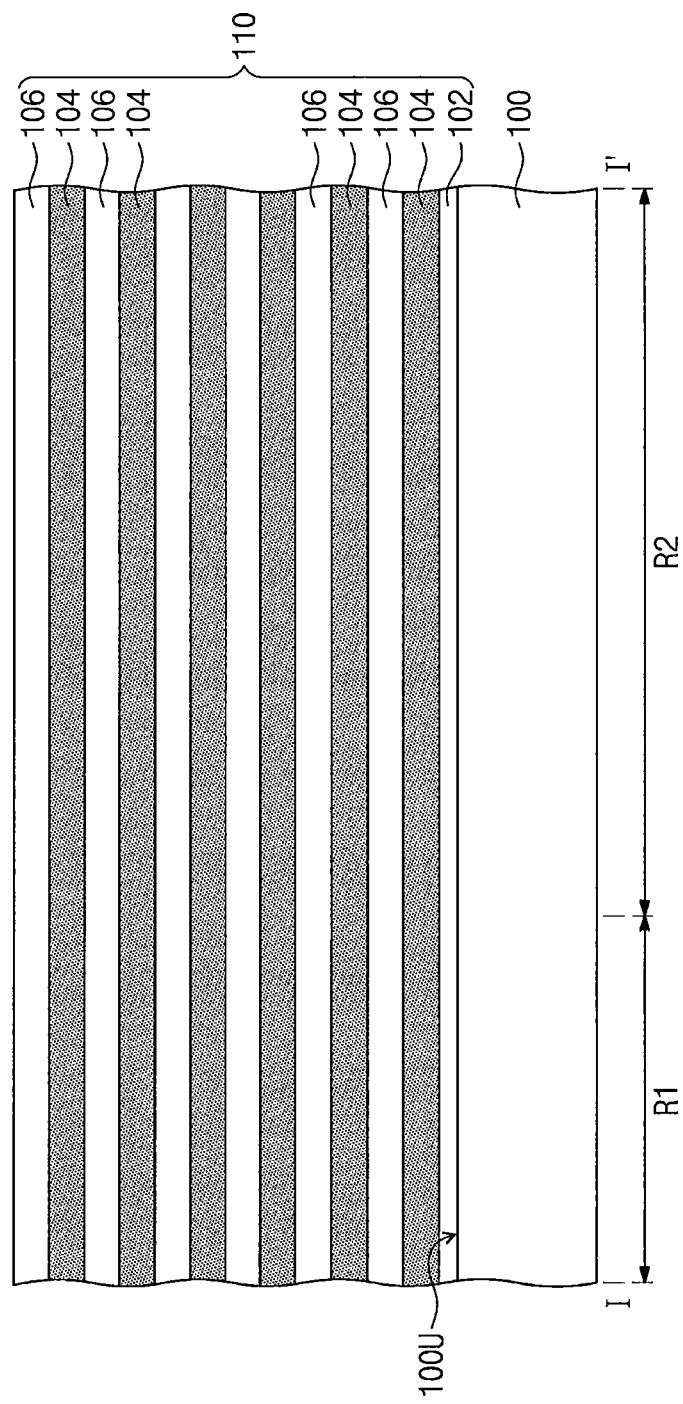

Referring to FIGS. 4A and 4B, a stack structure 110 may be formed on a substrate 100. The substrate 100 may include a first region R1 and a second region R2 different from each other, and the stack structure 110 may be formed to cover both the first region R1 and the second region R2. The first region R1 may be a region on which memory cells are provided, and the second region R2 may be a region on which pads for applying voltages to the memory cells are provided.

The stack structure 110 may include a lower insulating layer 102, and sacrificial layers 104 and insulating layers 106 alternately and repeatedly stacked on the lower insulating layer 102. The lower insulating layer 102, the sacrificial layers 104 and the insulating layers 106 may be stacked in a direction perpendicular to a top surface 100U of the substrate 100. A lowermost one of the sacrificial layers 104 may be between the lower insulating layer 102 and a lowermost one of the insulating layers 106. For example, the substrate 100 may be a silicon substrate, a germanium substrate, or a silicon-germanium substrate. For example, the lower insulating layer 102 may include a silicon oxide layer formed by a thermal oxidation process or a deposition technique. The sacrificial layers 104 may include a material having an etch selectivity with respect to the insulating layers 106. For example, each of the sacrificial layers 104 may include at least one of a silicon layer, a silicon oxide layer, a silicon carbide layer, a silicon oxynitride layer, or a silicon nitride layer. Each of the insulating layers 106 may include at least one of a silicon layer, a silicon oxide layer, a silicon carbide layer, a silicon oxynitride layer, or a silicon nitride layer. Here, the insulating layers 106 may include a different material from that of the sacrificial layers 104.

The lower insulating layer 102, the sacrificial layers 104, and the insulating layers 106 may have thicknesses in the direction perpendicular to the top surface 100U of the substrate 100. The thicknesses of the sacrificial layers 104 may be equal to each other, or the lowermost sacrificial layer 104 may be thicker than other sacrificial layers 104 stacked thereon. The thicknesses of the insulating layers 106 may be equal to each other, or the lowermost insulating layer 106 may be thicker than other insulating layers 106 stacked thereon. The lower insulating layer 102 may be thinner than the sacrificial layers 104 and the insulating layers 106 formed thereon.

Figure 5A:
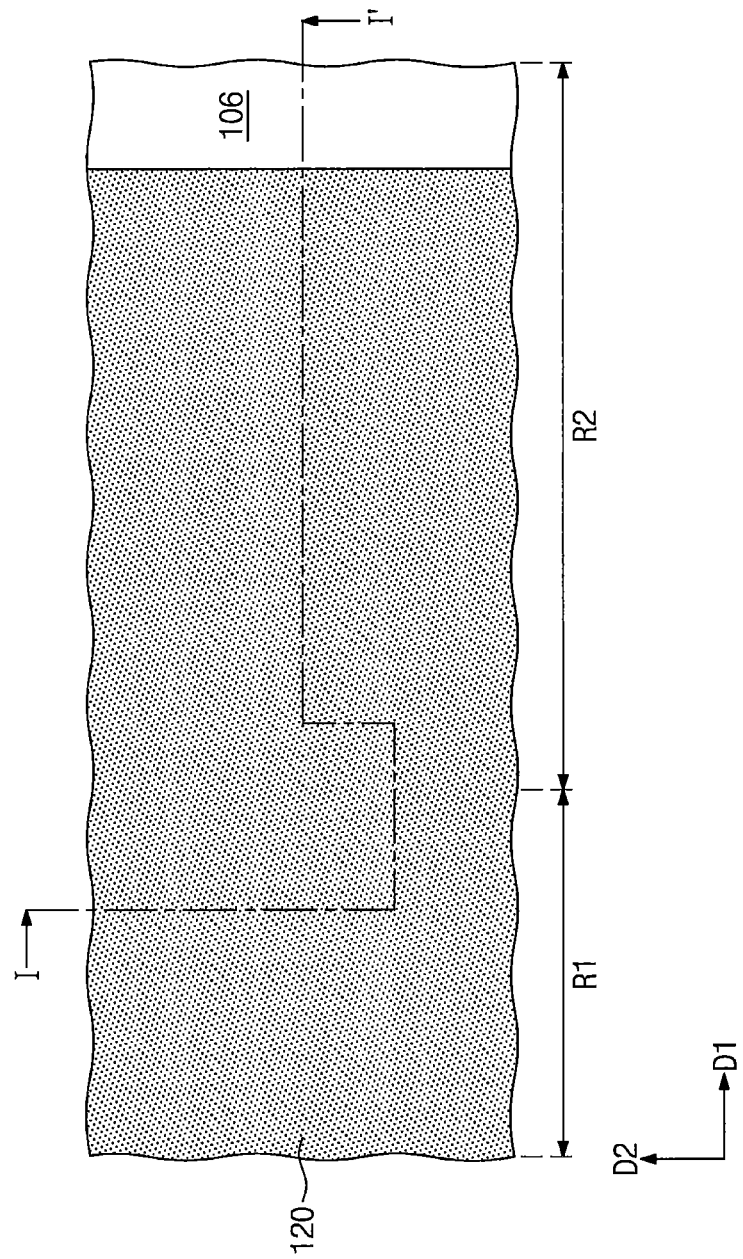
Figure 5B:
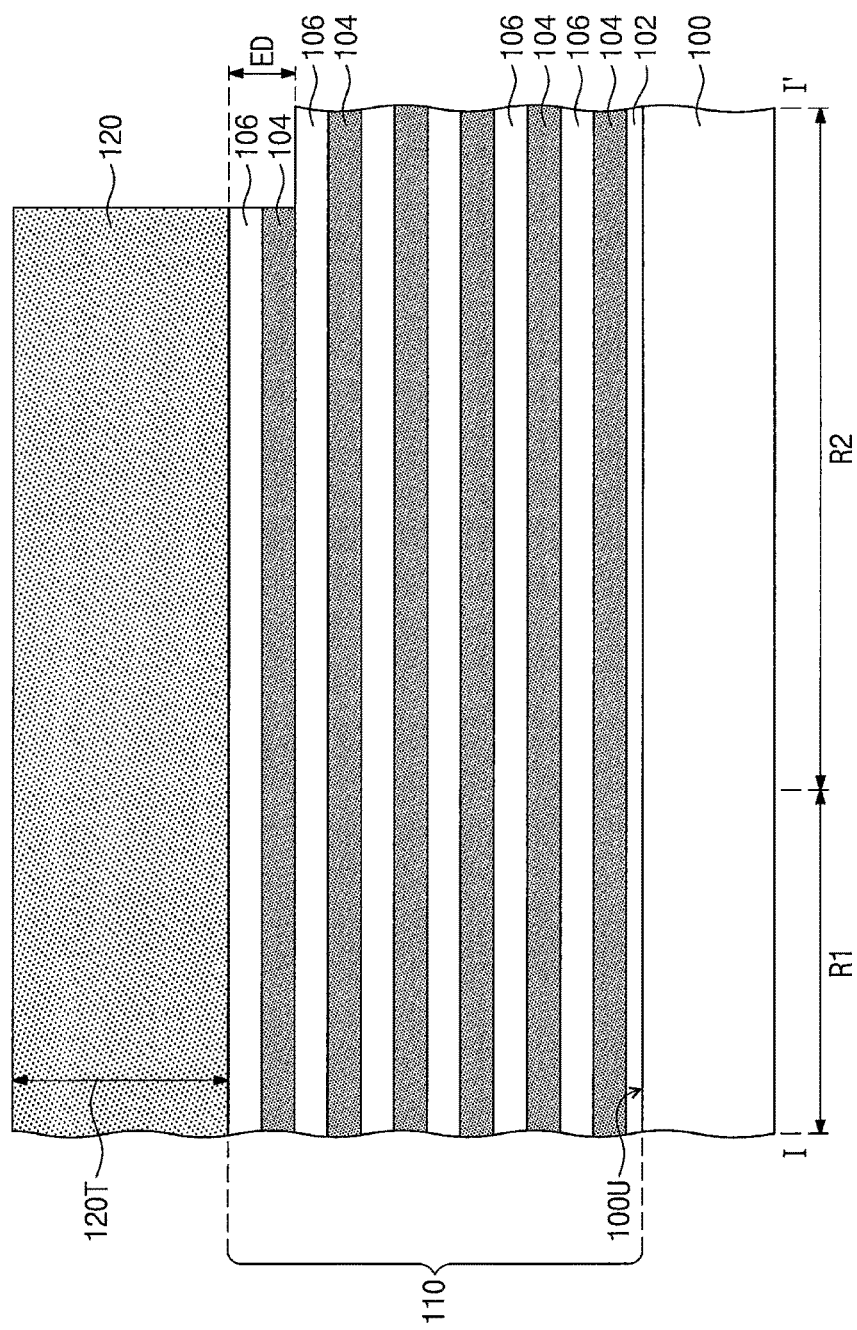

Referring to FIGS. 5A and 5B, a mask pattern 120 may be formed on the stack structure 110. The mask pattern 120 may be formed to cover the first region R1 and the second region R2. The mask pattern 120 may expose a portion of the stack structure 110 on the second region R2. The mask pattern 120 may have a thickness 120T in the direction perpendicular to the top surface 100U of the substrate 100. The mask pattern 120 may include, for example, a photoresist material. A pad etching process of etching the stack structure 110 using the mask pattern 120 as an etch mask may be performed. The portion of the stack structure 110 may be etched by an etching depth ED through the pad etching process. The etching depth ED by the pad etching process may correspond to a sum of the thickness of at least one insulating layer 106 and the thickness of at least one sacrificial layer 104.

Figure 6B:
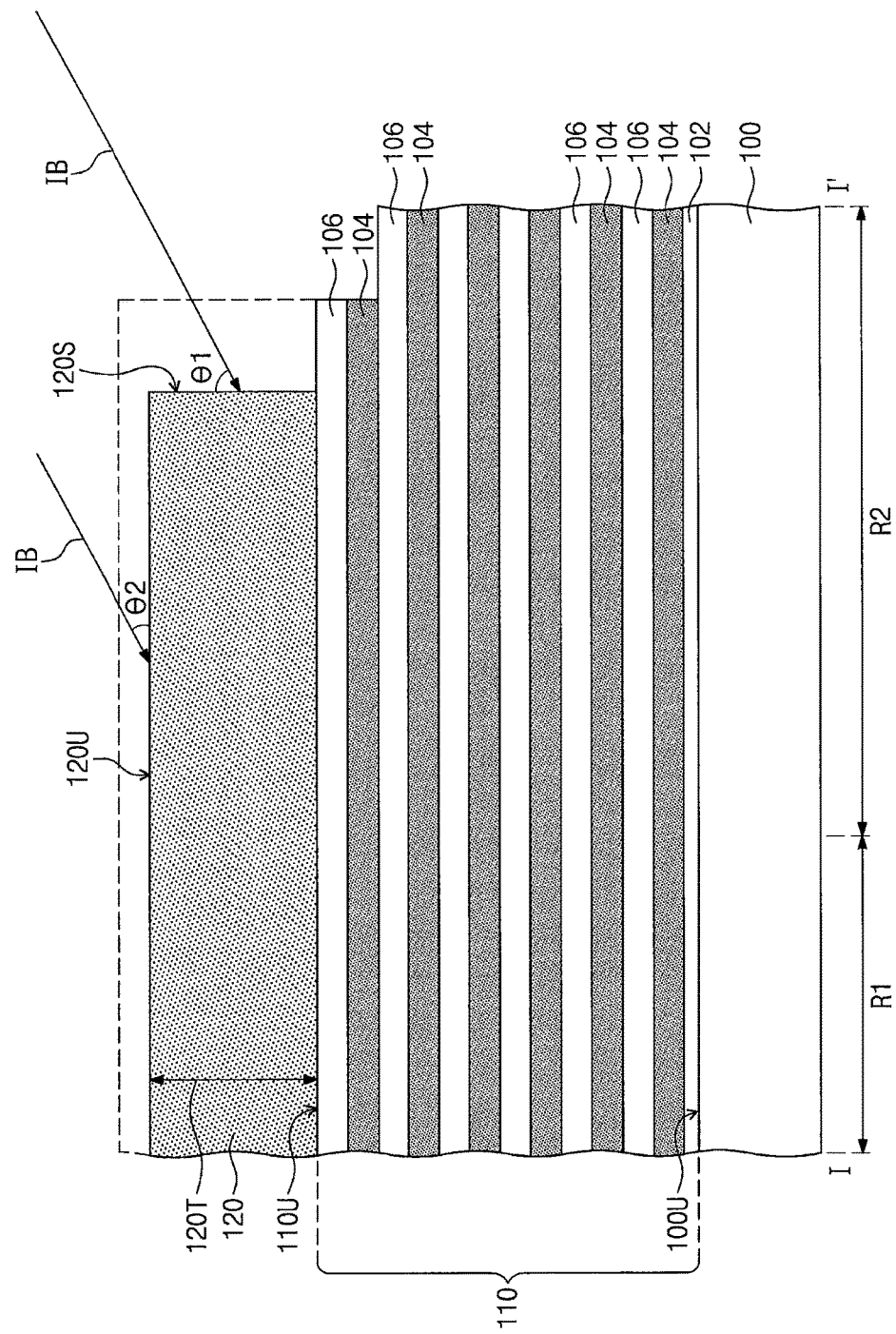

Referring to FIGS. 6A and 6B, a mask etching process of etching a sidewall 120S of the mask pattern 120 may be performed after the pad etching process. A portion of a topmost surface 110U of the stack structure 110 on the second region R2 may be exposed by the mask etching process. The mask etching process may be the etching process using the ion beam IB (hereinafter, referred to as an ion beam etching process), described with reference to FIG. 1. The mask etching process may be an ion beam etching process using an inert gas (e.g., argon) as an ion source or an ion beam etching process using a reactive gas (e.g., oxygen or carbon tetrafluoride) as an ion source.

In more detail, after the pad etching process, the substrate 100 having the mask pattern 120 may be loaded on the stage 60 of the apparatus 1000 described with reference to FIG. 1. The grid 50 may be provided over the substrate 100, and the ion beam IB may be irradiated onto the substrate 100 through the grid 50. The grid 50 and the substrate 100 may be relatively disposed such that the ion beam IB is irradiated at the tilt angle θt with respect to the top surface 100U of the substrate 100, for example as shown in FIG. 2 or FIG. 3.

The ion beam IB may be irradiated to the sidewall 120S of the mask pattern 120 at a first tilt angle θ1 with respect to the sidewall 120S of the mask pattern 120 and may be irradiated to a top surface 120U of the mask pattern 120 at a second tilt angle θ2 with respect to the top surface 120U of the mask pattern 120. The second tilt angle θ2 may correspond to the tilt angle θt. For example, the second tilt angle θ2 may be substantially equal to the tilt angle θt. The first tilt angle θ1 may be different from the second tilt angle θ2. The first tilt angle θ1 may be greater than the second tilt angle θ2. The first tilt angle θ1 and the second tilt angle θ2 may be represented by the following equation, Equation 1.

$$\theta 1 = 90° - \theta 2 \quad \text{[Equation 1]}$$

In Equation 1, "θ1" and "θ2" are the first tilt angle θ1 and the second tilt angle θ2, measured in degrees, respectively. The first tilt angle θ1 may be a complementary angle to the second tilt angle θ2.

The ion beam IB may be irradiated at a relatively high angle with respect to the sidewall 120S of the mask pattern 120 and may be irradiated at a relatively low angle with respect to the top surface 120U of the mask pattern 120.

Referring to FIG. 14, an etch rate of the mask pattern 120 may be changed depending on a tilt angle of the ion beam IB with respect to one surface of the mask pattern 120. In the event that the mask pattern 120 includes the photoresist material (e.g., a carbon-containing material), the etch rate of the mask pattern 120 may increase as the tilt angle of the ion beam IB increases.

Referring again to FIGS. 6A and 6B, the ion beam IB may be irradiated at the first tilt angle θ1 with respect to the sidewall 120S of the mask pattern 120 and may be irradiated at the second tilt angle θ2 with respect to the top surface 120U of the mask pattern 120. The first tilt angle θ1 may be greater than the second tilt angle θ2. Thus, during the mask etching process, an etch rate of the sidewall 120S of the mask pattern 120 may be higher than an etch rate of the top surface 120U of the mask pattern 120. As a result, an etching amount of the top surface 120U of the mask pattern 120 may be minimized while the sidewall 120S of the mask pattern 120 is etched by a desired etching amount through the mask etching process. In other words, reduction of the thickness 120T of the mask pattern 120 may be minimized during the mask etching process.

The second tilt angle θ2 may decrease as the first tilt angle θ1 increases. In this case, during the mask etching process, the etch rate of the top surface 120U may decrease as the etch rate of the sidewall 120S increases. The first tilt angle θ1 and the second tilt angle θ2 may be determined such that the sidewall 120S of the mask pattern 120 is etched by the desired etching amount but the reduction of the thickness 120T of the mask pattern 120 is minimized during the mask etching process. For example, the first tilt angle θ1 may be greater than about 45 degrees and less than about 90 degrees, and the second tilt angle θ2 may be greater than about 0 degree and less than about 45 degrees.

The first tilt angle θ1 and the second tilt angle θ2 may be determined by adjusting the angle θp between the top surface 100U of the substrate 100 and the first surface 50S1 of the grid 50, as described with reference to FIGS. 2 and 3. In more detail, the tilt angle θt of the ion beam IB with respect to the top surface 100U of the substrate 100 may be adjusted by the adjusting the angle θp between the top surface 100U of the substrate 100 and the first surface 50S1 of the grid 50. The second tilt angle θ2 may correspond to the tilt angle θt, and the first tilt angle θ1 may be determined by the above equation.

The mask pattern 120 etched by the mask etching process may expose a portion of the stack structure 110 on the second region R2. The etched mask pattern 120 may expose the portion of the topmost surface 110U of the stack structure 110 on the second region R2. In other words, the etched mask pattern 120 may expose a portion of a top surface of an uppermost one (e.g., an uppermost insulating layer 106) of a plurality of the layers 102, 104 and 106 constituting the stack structure 110.

Figure 7A:
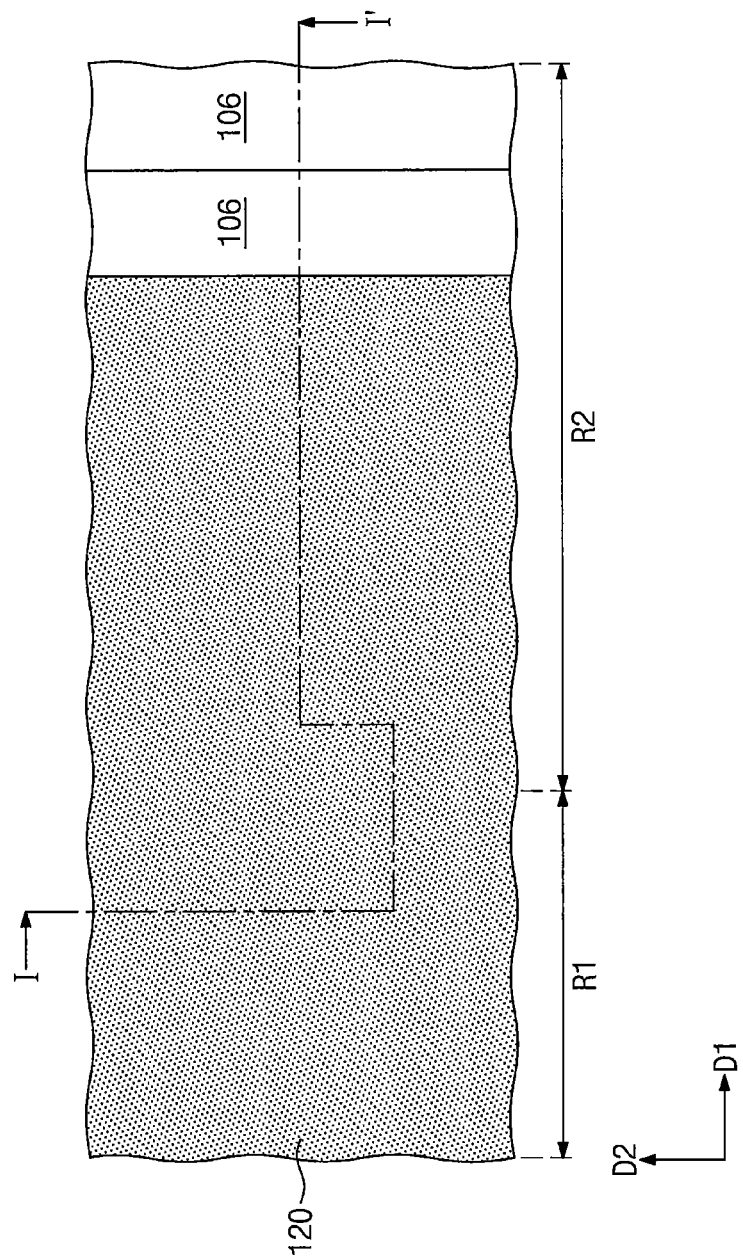
Figure 7B:
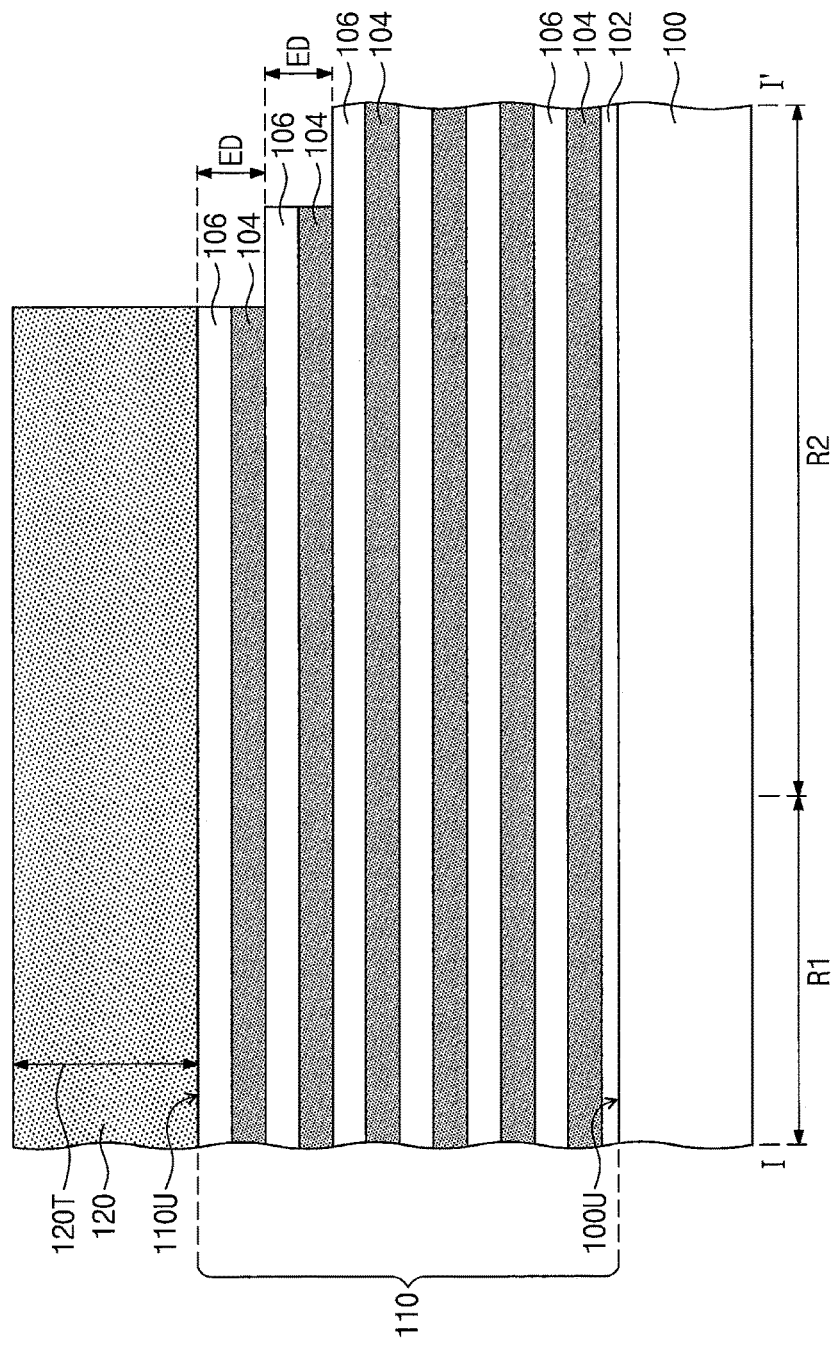

Referring to FIGS. 7A and 7B, the pad etching process may be repeated after the mask etching process. The pad etching process may be performed using the etched mask pattern 120 as an etch mask. The portion of the stack structure 110, which is exposed by the etched mask pattern 120, may be etched by the etching depth ED through the pad etching process. Thus, the stack structure 110 may have a stepped shape or stepped profile on the second region R2.

Figure 8A:
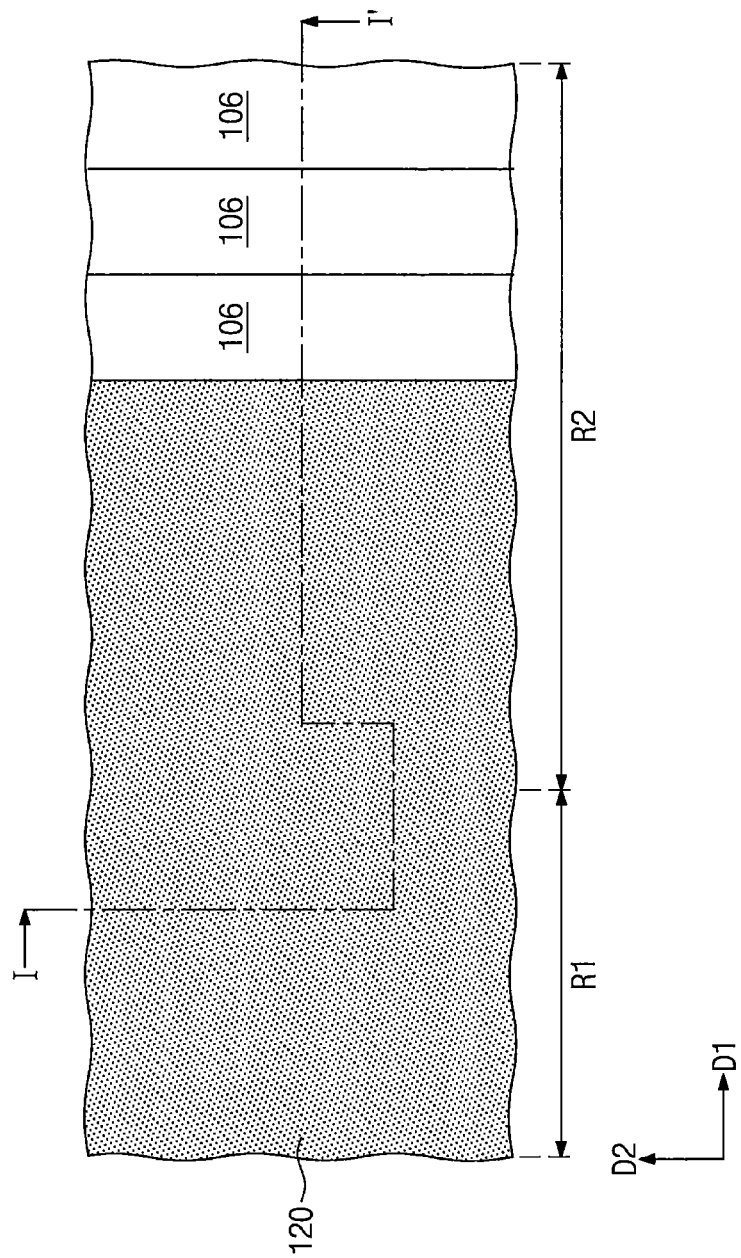
Figure 8B:
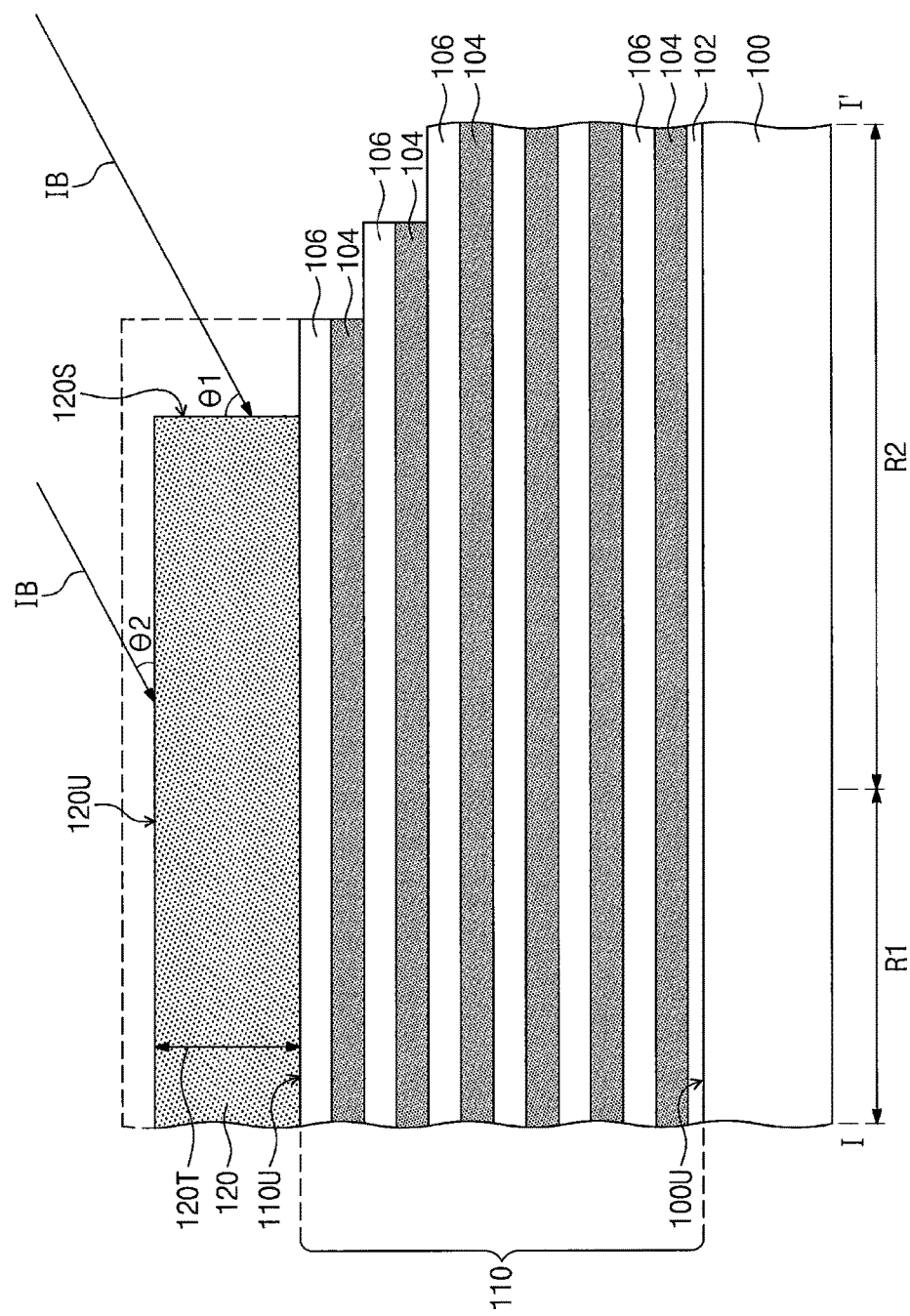

Referring to FIGS. 8A and 8B, next, the mask etching process may be repeated. As described above with reference to FIGS. 6A and 6B, the ion beam IB may be irradiated at the first tilt angle θ1 with respect to the sidewall 120S of the mask pattern 120 and may be irradiated at the second tilt angle θ2 with respect to the top surface 120U of the mask pattern 120. The first tilt angle θ1 and the second tilt angle θ2 may be determined such that the sidewall 120S of the mask pattern 120 is etched by a desired etching amount but reduction of the thickness 120T of the mask pattern 120 is minimized during the mask etching process. The mask pattern 120 additionally etched by the mask etching process may expose a portion of the stack structure 110 on the second region R2. The additionally etched mask pattern 120 may expose a portion of the topmost surface 110U of the stack structure 110 on the second region R2.

Figure 9A:
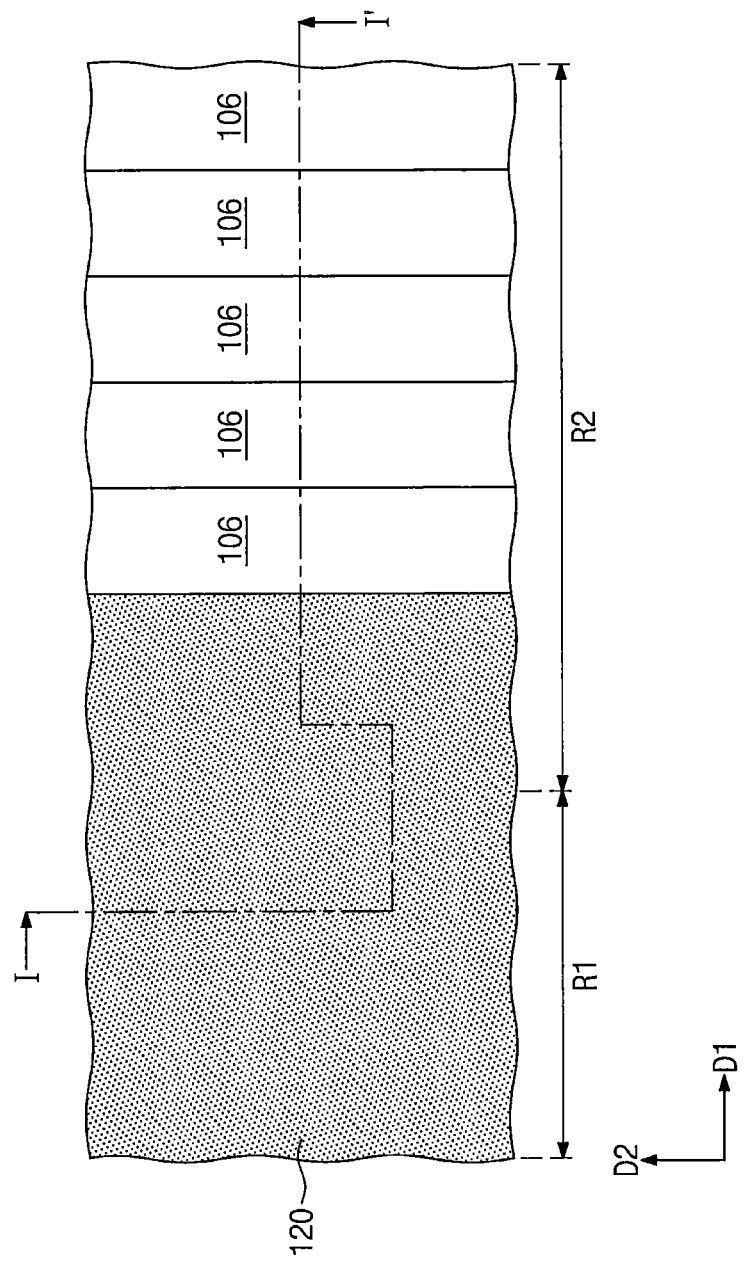

Referring to FIGS. 9A and 9B, the pad etching process and the mask etching process may be alternately and repeatedly performed. Thus, the stack structure 110 may be patterned to have an end portion having a stepped shape or stepped profile on the second region R2.

According to the aspects of the present disclosure, the mask etching process may be the etching process using the ion beam IB. The ion beam IB may be irradiated at the first tilt angle θ1 with respect to the sidewall 120S of the mask pattern 120 and may be irradiated at the second tilt angle θ2 with respect to the top surface 120U of the mask pattern 120. The first tilt angle θ1 and the second tilt angle θ2 may be determined such that the sidewall 120S of the mask pattern 120 is etched by the desired etching amount but the reduction of the thickness 120T of the mask pattern 120 is minimized during the mask etching process. Thus, a loss of the mask pattern 120 may be minimized while the stack structure 110 is patterned to have the end portion having the stepped shape or stepped profile. In this case, it is possible to reduce or minimize the number of additional mask patterns required for forming the stack structure 110 having the end portion of the stepped shape or stepped profile.

Figure 10A:
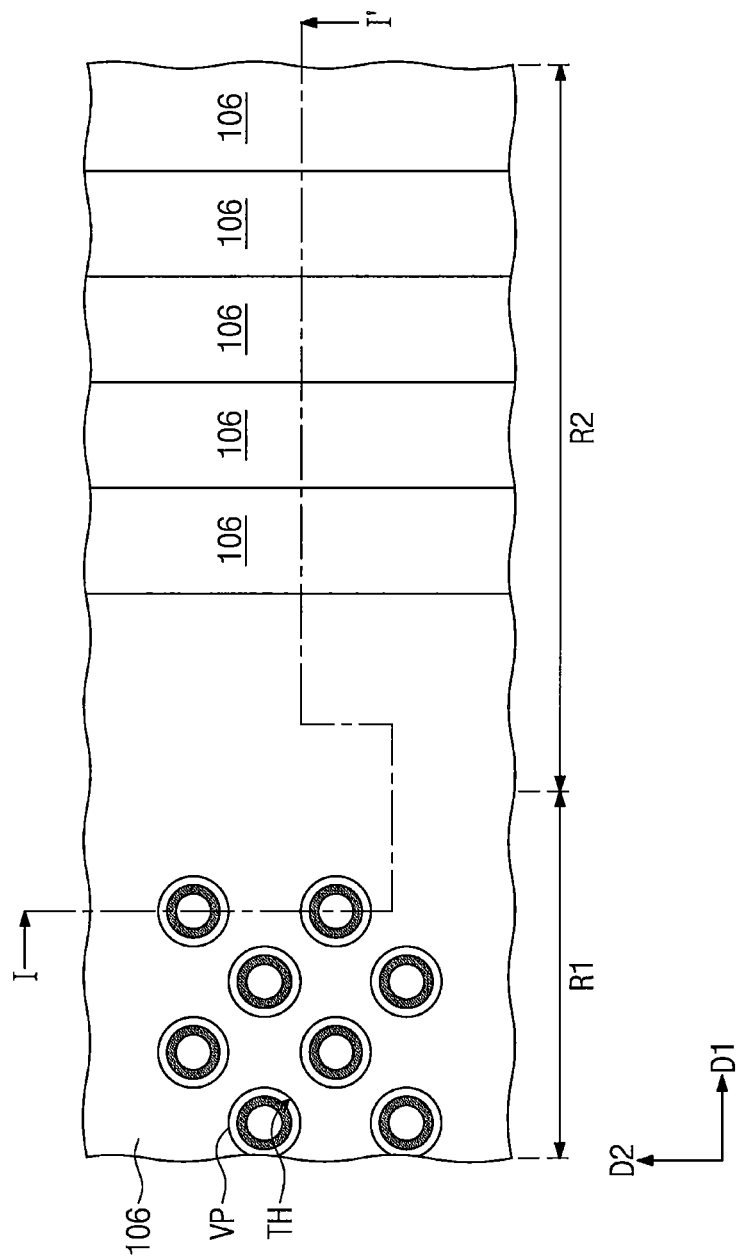
Figure 10B:
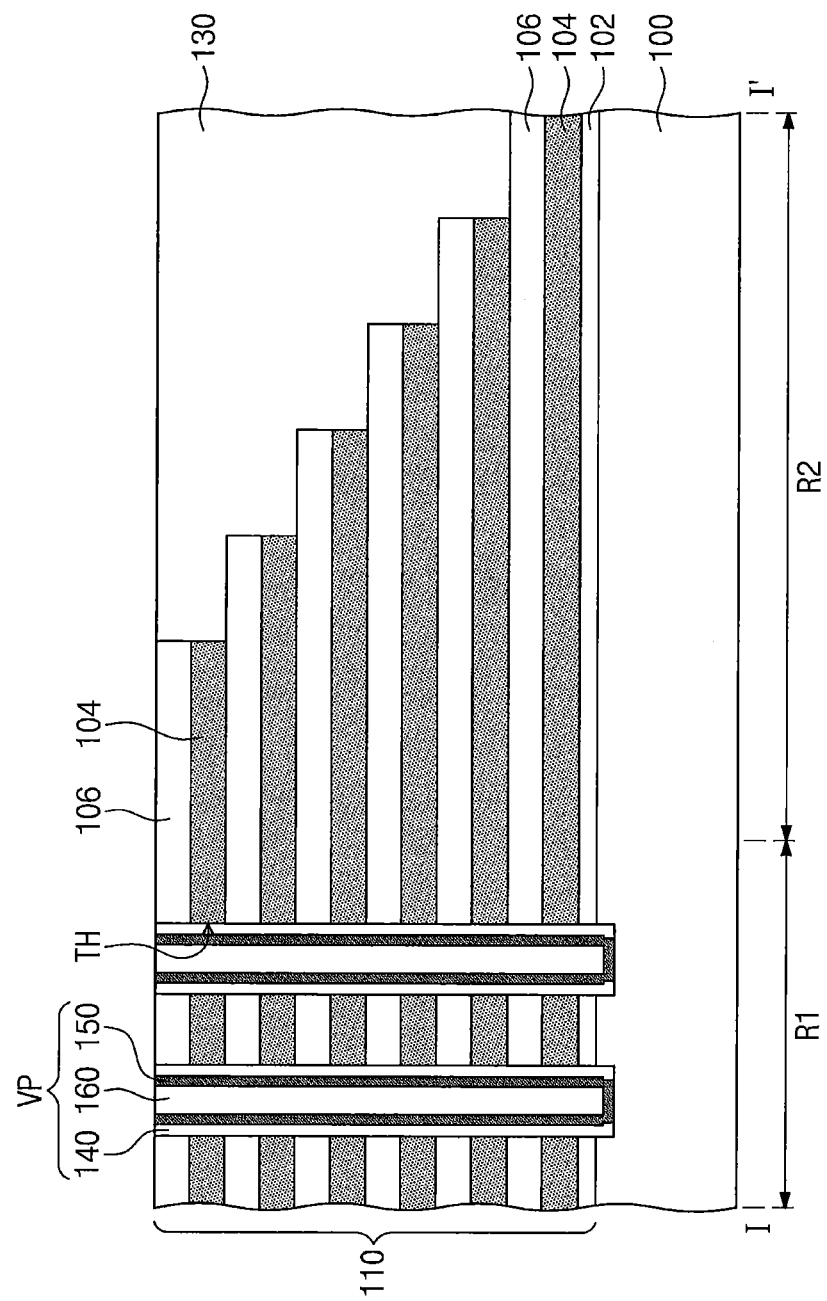

Referring to FIGS. 10A and 10B, the mask pattern 120 which remains may be removed. The mask pattern 120 may be removed by, for example, an ashing process and/or a strip process. Thereafter, a capping insulating pattern 130 may be formed on the substrate 100 to cover the end portion, having the stepped shape or stepped profile, of the stack structure 110. Hereinafter, an illustration of the capping insulating pattern 130 will be omitted from FIGS. 10A, 11A, and 12A, to clearly illustrate the end portion, having the stepped shape or stepped profile, of the stack structure 110 in a plan view. The formation of the capping insulating pattern 130 may include forming a capping insulating layer covering the stack structure 110 on the substrate 100, and planarizing the capping insulating layer until a top surface of the stack structure 110 (e.g., the top surface of the uppermost insulating layer 106) is exposed. The capping insulating layer may include at least one of an oxide layer, a nitride layer, or an oxynitride layer.

Through-holes TH may be formed to penetrate the stack structure 110 on the first region R1. Each of the through-holes TH may penetrate the stack structure 110 to expose the substrate 100. The through-holes TH may be arranged along a first direction D1 and a second direction D2 intersecting the first direction D1 when viewed in a plan view. In some embodiments, the through-holes TH constituting each row may be arranged in a zigzag form along the first direction D1. The formation of the through-holes TH may include forming a mask layer (not shown) having openings defining the through-holes TH on the stack structure 110, and anisotropically etching the stack structure 110 using the mask layer as an etch mask.

Vertical patterns VP may be formed in the through-holes TH, respectively. Each of the vertical patterns VP may include a vertical insulator 140, a semiconductor pattern 150, and a filling insulation pattern 160. The vertical insulator 140 may cover an inner sidewall of each of the through-holes TH and may expose the substrate 100. The formation of the vertical insulator 140 may include forming a vertical insulating layer covering inner surfaces of the through-holes TH on the stack structure 110, and anisotropically etching the vertical insulating layer. The vertical insulator 140 may have a hollow pipe or macaroni shape having opened both ends. The vertical insulator 140 may include a blocking insulating layer, a charge storage layer and a tunnel insulating layer, which are sequentially stacked on the inner sidewall of each of the through-holes TH formed in the stack structure 110. The vertical insulator 140 will be additionally described later.

The formation of the semiconductor pattern 150 and the filling insulation pattern 160 may include forming a semiconductor layer conformally covering the inner surfaces of the through-holes TH, forming a filling insulation layer filling remaining regions of the through-holes TH on the semiconductor layer, and planarizing the filling insulation layer and the semiconductor layer until the top surface of the stack structure 110 is exposed. The semiconductor layer may include a semiconductor material (e.g., a poly-crystalline silicon layer, a single-crystalline silicon layer, or an amorphous silicon layer) formed using an atomic layer deposition (ALD) process or a chemical vapor deposition (CVD) process. The filling insulation layer may include an insulating layer or silicon oxide layer formed using a spin-on-glass (SOG) method. The semiconductor pattern 150 may have a pipe shape having one closed end, a hollow cylindrical shape having one closed end or a cup shape in each of the through-holes TH. The semiconductor pattern 150 may be connected to the substrate 100. The filling insulation pattern 160 may be formed to fill each of the through-holes TH, in which the semiconductor pattern 150 is formed.

Figure 11A:
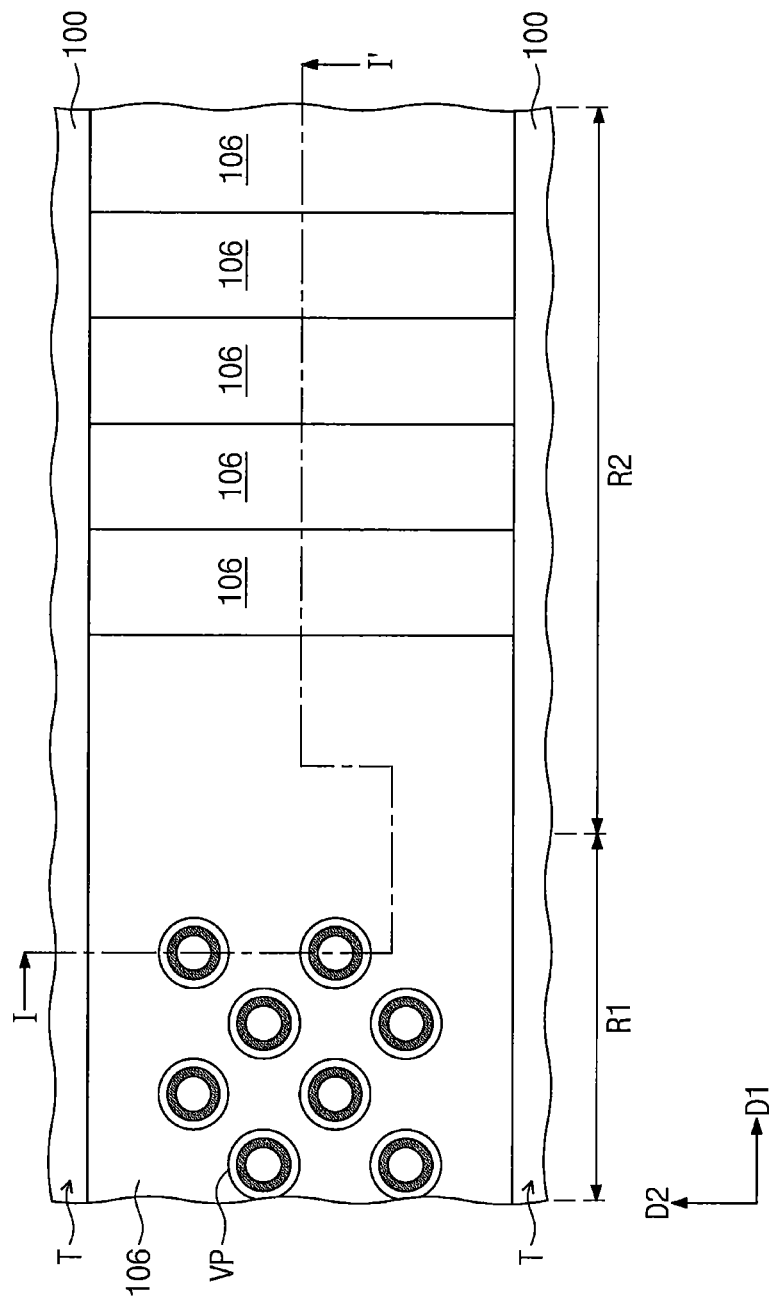

Referring to FIGS. 11A and 11B, the capping insulating pattern 130, the insulating layers 106, the sacrificial layers 104 and the lower insulating layer 102 may be patterned to form trenches T exposing the substrate 100. The trenches T may extend in the first direction D1 and may be spaced apart from each other in the second direction D2, when viewed in a plan view. Thus, the stack structure 110 may be patterned to have a line shape extending in the first direction D1 when viewed in a plan view. The patterned stack structure 110 may extend from the first region R1 to the second region R2 between the trenches T.

The sacrificial layers 104 exposed by the trenches T may be removed to form recess regions R between the insulating layers 106. The recess regions R may extend from the trenches T into between the insulating layers 106 in a direction parallel to the top surface of the substrate 100. The sacrificial layers 104 may be removed by an isotropic etching process (e.g., a wet etching process). The recess regions R may expose portions of sidewalls of the vertical patterns VP.

Figure 12A:
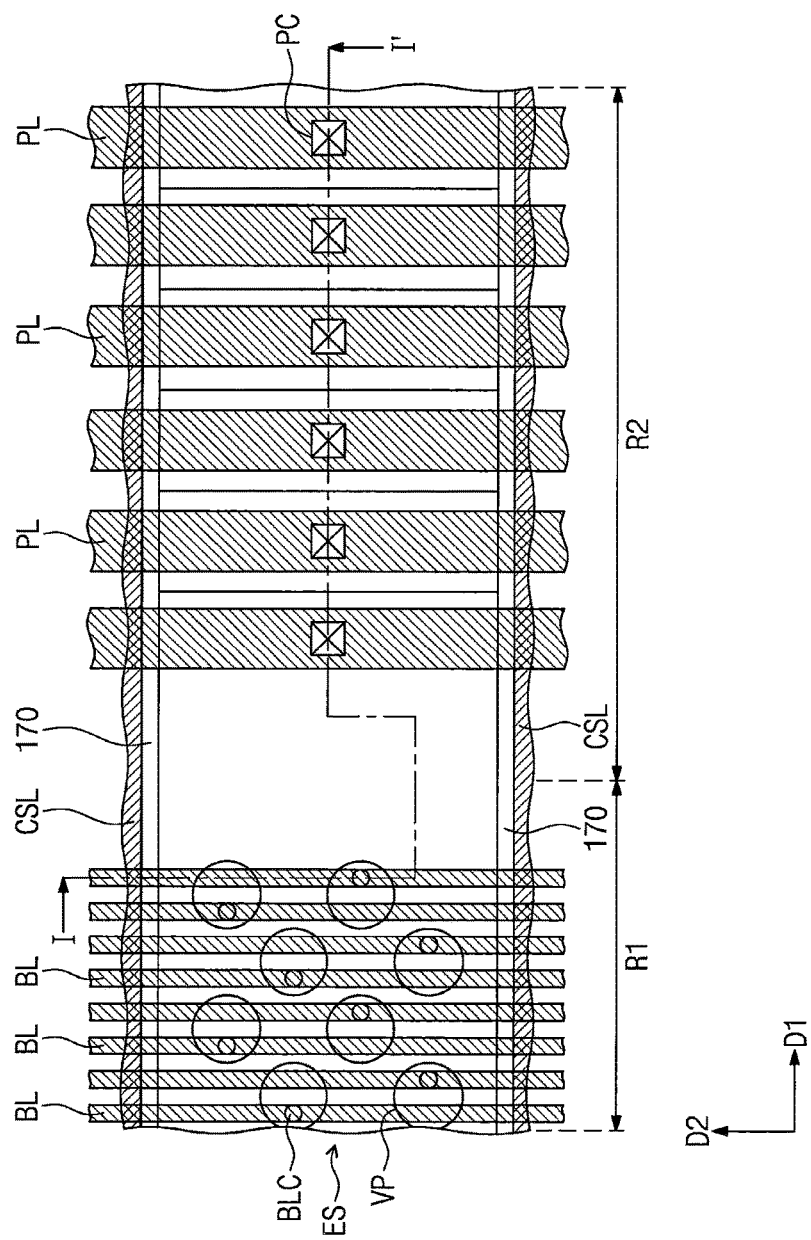
Figure 12B:
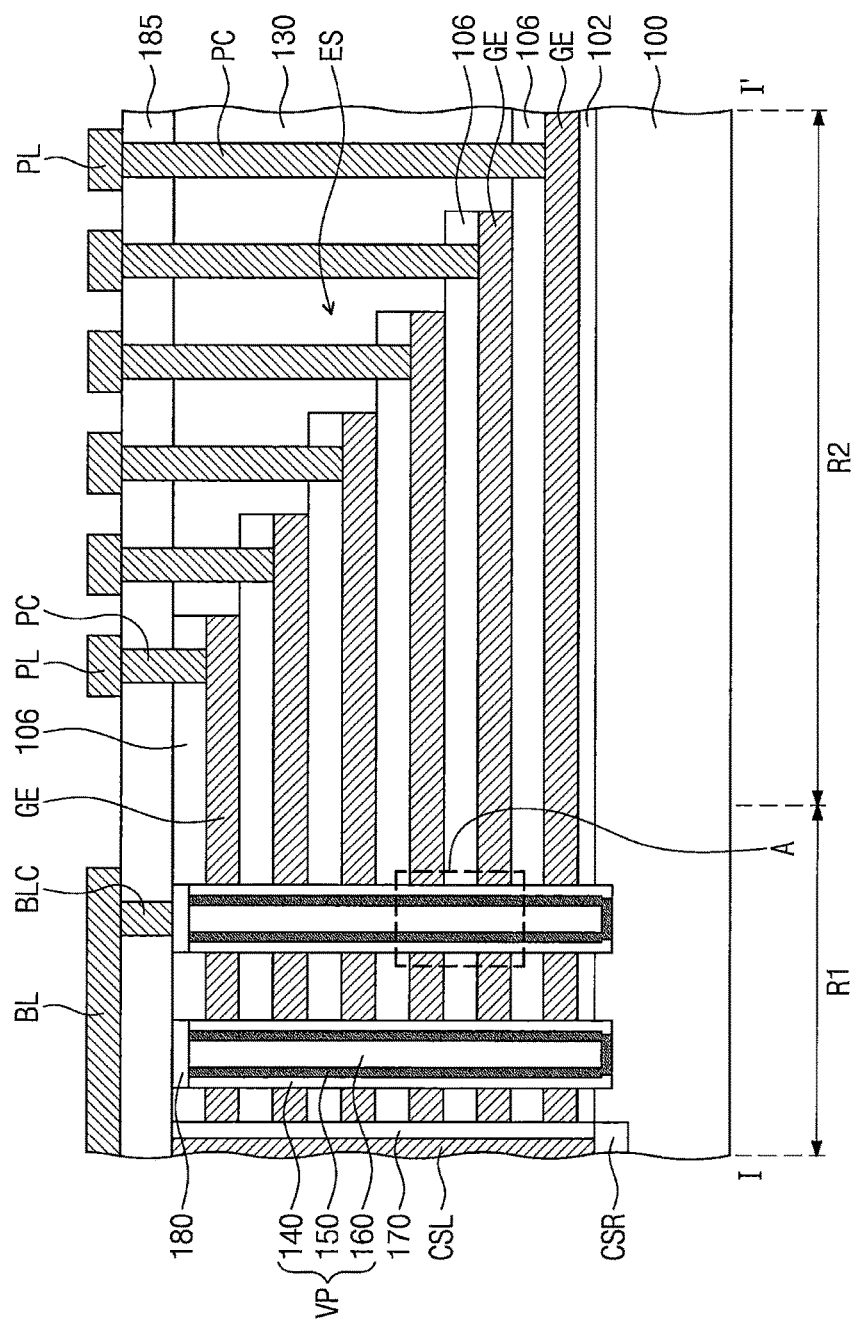

Referring to FIGS. 12A and 12B, gate electrodes GE may be formed to fill the recess regions R, respectively. The formation of the gate electrodes GE may include forming a conductive layer filling the recess regions R, and removing the conductive layer in the trenches T to locally form the gate electrodes GE in the recess regions R, respectively. In some embodiments, the formation of the conductive layer may include sequentially depositing a barrier metal layer and a metal layer. For example, the barrier metal layer may be formed of a metal nitride layer such as TiN, TaN, or WN, and the metal layer may be formed of a metal material such as W, Al, Ti, Ta, Co, or Cu. The gate electrodes GE and the insulating layers 106 therebetween may be defined as an electrode structure ES. The electrode structure ES may have an end portion that has a stepped shape or stepped profile on the second region R2. The gate electrodes GE may respectively include pads that correspond to the end portion, having the stepped shape or stepped profile, of the electrode structure ES.

Referring to FIG. 13, the vertical insulator 140 may include a blocking insulating layer BIL, a charge storage layer CL and a tunnel insulating layer TL, which may be between the semiconductor pattern 150 and the gate electrodes GE. The blocking insulating layer BIL may be adjacent to the gate electrodes GE, and the tunnel insulating layer TL may be adjacent to the semiconductor pattern 150. The charge storage layer CL may be between the blocking insulating layer BIL and the tunnel insulating layer TL. For example, the tunnel insulating layer TL may include at least one of a silicon oxide layer or a silicon oxynitride layer. The charge storage layer CL may include at least one of a silicon nitride layer including trap sites or an insulating layer including conductive nano dots. The blocking insulating layer BIL may include a high-k dielectric layer of which a dielectric constant is higher than that of the tunnel insulating layer TL. In addition, the blocking insulating layer BIL may further include a barrier insulating layer (e.g., a silicon oxide layer) of which an energy band gap is greater than that of the high-k dielectric layer.

Referring again to FIGS. 12A and 12B, common source regions CSR may be formed in the substrate 100 after the formation of the gate electrodes GE. The common source regions CSR may be formed by performing an ion implantation process on the substrate 100 under the trenches T. The common source regions CSR may have a different conductivity type from that of the substrate 100.

Common source lines CSL and insulating spacers 170 may be formed in the trenches T. The common source lines CSL may be electrically connected to the common source regions CSR, and the insulating spacers 170 may electrically insulate the common source lines CSL from the gate electrodes GE. The formation of the insulating spacers 170 may include forming an insulating spacer layer conformally covering top surfaces of the common source regions CSR and inner sidewalls of the trenches T, and anisotropically etching the insulating spacer layer. The common source regions CSR may be exposed by the anisotropic etching process. Thereafter, a conductive layer may be formed to fill remaining regions of the trenches T. The conductive layer may be planarized to locally form the common source lines CSL in the trenches T, respectively.

Conductive pads 180 may be formed on the vertical patterns VP, respectively. Upper portions of the vertical patterns VP may be recessed, and the conductive pads 180 may be formed by filling the recessed regions with a conductive material.

An interlayer insulating layer 185 may be formed on an entire top surface of the substrate 100. The interlayer insulating layer 185 may cover the electrode structure ES and may extend in a direction parallel to the top surface of the substrate 100 to cover top surfaces of the insulating spacers 170, top surfaces of the common source lines CSL, and a top surface of the capping insulating pattern 130. The interlayer insulating layer 185 may include at least one of an oxide layer, a nitride layer, or an oxynitride layer.

Pad contacts PC may be formed on the pads of the gate electrodes GE, respectively. The pad contacts PC may penetrate the interlayer insulating layer 185, the capping insulating pattern 130 and the insulating layers 106 on the second region R2 so as to be connected to the pads of the gate electrodes GE, respectively. Bit line contact plugs BLC may be formed on the vertical patterns VP, respectively. The bit line contact plugs BLC may penetrate the interlayer insulating layer 185 on the first region R1 so as to be connected to the vertical patterns VP, respectively. The bit line contact plugs BLC may be electrically connected to the vertical patterns VP through the conductive pads 180, respectively. The pad contacts PC and the bit line contact plugs BLC may be formed of a conductive material.

Bit lines BL may be formed on the interlayer insulating layer 185 disposed on the first region R1. The bit lines BL may extend in the second direction D2 and may be spaced apart from each other in the first direction D1. Each of the bit line contact plugs BLC may be connected to a corresponding one of the bit lines BL. Pad interconnection lines PL may be formed on the interlayer insulating layer 185 disposed on the second region R2. The pad interconnection lines PL may extend in the second direction D2 and may be spaced apart from each other in the first direction D1. However, the present disclosure is not limited thereto. The pad interconnection lines PL may be connected to the pad contacts PC, respectively. The bit lines BL and the pad interconnection lines PL may be formed of a conductive material.

According to the aspects of the present disclosure, the loss of the mask pattern 120 may be minimized while the stack structure 110 is patterned to have the end portion having the stepped shape or stepped profile. Thus, it is possible to reduce or minimize the number of additional mask patterns required for forming the stack structure 110 having the end portion of the stepped shape or stepped profile. As a result, processes of manufacturing the semiconductor device using the stack structure 110 may be simplified, and manufacture costs of the semiconductor device may be reduced.

While the inventive concepts have been described with reference to example embodiments, it will be apparent to those skilled in the art that various changes and modifications may be made without departing from the inventive concepts. Therefore, it should be understood that the above embodiments are not limiting, but illustrative. Thus, the inventive concepts provided herein are to be determined by the broadest permissible interpretation of the following claims and their equivalents, and shall not be restricted or limited by the foregoing description.

What is claimed is:

1. A method for manufacturing a semiconductor device, the method comprising:
   forming a stack structure comprising a plurality of layers vertically stacked on a substrate;
   forming a mask pattern on the stack structure; and
   patterning the stack structure using the mask pattern as an etch mask such that the stack structure has an end portion with a stepped profile,
   wherein the patterning of the stack structure comprises:
   performing a pad etching process of etching the stack structure using the mask pattern as an etch mask; and
   performing a mask etching process of etching a sidewall of the mask pattern to expose a portion of a topmost surface of the stack structure,
   wherein the performing of the mask etching process comprises irradiating an ion beam onto the mask pattern,
   wherein, during the mask etching process, the ion beam is irradiated at a first tilt angle with respect to the sidewall of the mask pattern and is irradiated at a second tilt angle with respect to a top surface of the mask pattern, and
   wherein the first tilt angle is different from the second tilt angle.

2. The method of claim 1, wherein the first tilt angle is greater than the second tilt angle.

3. The method of claim 1, wherein the performing of the mask etching process further comprises:
   providing a grid having a plurality of holes penetrating therethrough, wherein the ion beam is irradiated onto the substrate through the plurality of holes, wherein the grid has a first surface and a second surface opposite to each other, and wherein the first surface faces a top surface of the substrate; and
   adjusting the first tilt angle and the second tilt angle by adjusting an angle between the top surface of the substrate and the first surface of the grid.

4. The method of claim 3, wherein the grid comprises a plurality of electrode plates vertically overlapping with each other, and each of the plurality of electrode plates has a plurality of holes penetrating therethrough, the plurality of holes of the plurality of electrode plates aligned to form the plurality of holes of the grid.

5. The method of claim 1, wherein the mask pattern includes a photoresist material.

6. The method of claim 1, wherein the patterning of the stack structure comprises repeatedly performing the pad etching process and the mask etching process in alternation.

7. The method of claim 1, wherein the mask etching process comprises an ion beam etching process using an inert gas as an ion source.

8. The method of claim 1, wherein the first tilt angle is greater than 45 degrees and less than 90 degrees.

9. The method of claim 8, wherein the second tilt angle is greater than 0 degrees and less than 45 degrees.

10. The method of claim 1, wherein the plurality of layers comprises: insulating layers and sacrificial layers repeatedly stacked in alternation in a direction perpendicular to a top surface of the substrate, and
    wherein the sacrificial layers include a different material from a material of the insulating layers.

11. The method of claim 10, further comprising:
    removing portions of the mask pattern remaining after the patterning of the stack structure;
    forming a plurality of vertical patterns in the stack structure, the vertical patterns penetrating the stack structure and connecting to the substrate;

selectively removing the sacrificial layers to form recess regions between the insulating layers; and forming gate electrodes in the recess regions, wherein the gate electrodes respectively comprise pads that correspond to the end portion of the stack structure that has the stepped profile.

12. A method for manufacturing a semiconductor device, the method comprising:

forming a stack structure comprising a plurality of layers vertically stacked on a substrate;

forming a mask pattern on the stack structure;

performing a pad etching process of etching the stack structure using the mask pattern as an etch mask, wherein the pad etching process comprises etching the stack structure to an etching depth that corresponds to a sum of a thickness of at least a first layer of the stack structure and a thickness of at least a second layer of the stack structure; and performing a mask etching process of etching a sidewall of the mask pattern to expose a portion of a topmost surface of the stack structure, after the pad etching process, wherein the mask etching process comprises an ion beam etching process using an ion beam, wherein the ion beam is irradiated at a first tilt angle with respect to the sidewall of the mask pattern and is irradiated at a second tilt angle with respect to a top surface of the mask pattern, and wherein the first tilt angle is different from the second tilt angle.

13. The method of claim 12, wherein the performing of the mask etching process comprises:

providing a grid, wherein: the grid has a first surface and a second surface opposite to each other; and the first surface faces a top surface of the substrate; and adjusting the first tilt angle and the second tilt angle by adjusting an angle between the top surface of the substrate and the first surface of the grid, wherein the ion beam is irradiated to the substrate through a plurality of holes penetrating the grid.

14. The method of claim 13, wherein the adjusting of the first tilt angle and the second tilt angle comprises: rotating the substrate to adjust the angle between the top surface of the substrate and the first surface of the grid.

15. The method of claim 13, wherein the adjusting of the first tilt angle and the second tilt angle comprises: rotating the grid to adjust the angle between the top surface of the substrate and the first surface of the grid.

16. The method of claim 12, wherein the first tilt angle, measured in degrees, is equal to 90 degrees minus the second tilt angle, measured in degrees.

17. The method of claim 12, wherein the first tilt angle is greater than the second tilt angle.

18. The method of claim 12, wherein the mask etching process uses an inert gas or a reactive gas as an ion source.

19. The method of claim 12, wherein the pad etching process comprises a first pad etching process, the method further comprising:

performing a second pad etching process of etching the stack structure using the mask pattern, etched by the mask etching process, as an etch mask, after the mask etching process.

20. The method of claim 1, wherein the pad etching process comprises etching the stack structure to an etching depth that corresponds to a sum of a thickness of at least a first layer of the stack structure and a thickness of at least a second layer of the stack structure.

* * * * *